United States Patent
Dorrough et al.

(10) Patent No.: US 6,198,403 B1
(45) Date of Patent: Mar. 6, 2001

(54) POWER LINE METER/MONITOR WITH LED DISPLAY

(76) Inventors: Michael L. Dorrough, 5221 Coiller Pl., Woodland Hills, CA (US) 91364; Michael J. Cane, 1236 Division St., Green Bay, WI (US) 54303

( * ) Notice: Subject to any disclaimer, the term of this patent is extended or adjusted under 35 U.S.C. 154(b) by 0 days.

(21) Appl. No.: 09/545,129

(22) Filed: Apr. 7, 2000

Related U.S. Application Data (60) Provisional application No. 60/128,120, filed on Apr. 7, 1999.

(51) Int. Cl.[7] .................................................. G08B 21/00
(52) U.S. Cl. ........................ 340/635; 340/653; 340/660; 324/103 R; 324/133; 361/18; 361/90
(58) Field of Search ..................... 340/635, 649, 340/651, 653, 657, 660, 661; 361/18, 90; 324/103 R, 133, 511, 522, 523

(56) References Cited

U.S. PATENT DOCUMENTS

| | | | |
|---|---|---|---|
| 4,333,050 | * | 6/1982 | Yeasting ................................ 324/107 |
| 4,707,618 | * | 11/1987 | Haas ...................................... 307/64 |
| 4,999,730 | * | 3/1991 | Pickard .................................. 361/59 |
| 5,079,688 | * | 1/1992 | Kido ..................................... 363/125 |
| 5,555,483 | * | 9/1996 | Pressman et al. ...................... 361/90 |
| 6,038,516 | * | 3/2000 | Alexander et al. .................... 702/67 |

* cited by examiner

Primary Examiner—Edward Lefkowitz
(74) Attorney, Agent, or Firm—J. E. McTaggart (57) ABSTRACT

In this micro-controller-based line voltage meter/monitor instrument, an AC signal-under-test is sensed from the line voltage via a broadband isolation transformer, and processed to provide RMS and fast peak signals. These are A/D converted in the micro-controller in a sampling process synchronized from a zero-cross signal detected from the AC voltage-under-test. An LED (light-emitting diode) display with 40 LED segments provides resolution of one volt RMS per LED step/segment, and is color-coded to overlay the CBEMA nominal limits. RMS values ranging from 95 to 135 volts are indicated on a bar graph, and fast peak values ranging from 120 to 500 volts at the waveform crest are indicated by the selected LED cell flashing at a 1 Hz rate, with selectable peak hold time. An internal real time calendar/clock enables accumulation of time-related data regarding the ongoing quality of the power line voltage levels. A variety of parameters and alarm limits can be configured by the user via a DIP switch and/or a user port, accessible at the rear of the instrument, by which the instrument can be connected in two-way communication with an external computer or control terminal, e.g. with a keyboard and/or CRT monitor, to provide a variety of extended capabilities.

19 Claims, 9 Drawing Sheets

POWER LINE METER/MONITOR WITH LED DISPLAY

PRIORITY

Benefit is claimed under 35 U.S.C, § 119(e) of pending provisional application No. 60/128,120 filed Apr. 7, 1999.

FIELD OF THE INVENTION

The present invention relates to the field of quality control of a.c. electrical power as supplied to a wide range of consumers including commercial, residential and industrial users, and more particularly it relates to advanced electronic test equipment for continuously monitoring and evaluating the quality of power line voltage with regard to unacceptable anomalies that can disrupt, damage and even destroy valuable electronic equipment, especially computers as used in business, industry and communications.

BACKGROUND OF THE INVENTION

Powerline monitoring has evolved a long way from the early years of a.c. power, when the electrical service was subject to very few regulatory standards. Monitoring the power line often involved nothing more than measuring it continuously with some form of a.c. voltmeter to verify that the voltage level was being 30 held within designated limits, typically 105 to 130 volts. There were frequent outages, lightning strikes and other excursions beyond the normal limits, however much of the a.c. power-operated equipment was relatively simple, robust and tolerant to transient power line anomalies, so power line voltage quality was not a matter of great concern at that time.

With the passage of time, as electrical power usage intensified and particularly with the advent of the computer age and the proliferation of complex electronic equipment of many different kinds, although the electrical power industry had made much progress overall in regulating line voltage and minimizing outages, power-line related disruptions and damage continued to increase rapidly, calling a great deal of new attention to power line quality, and a large new market developed for equipment both for the protection of the payloads as well as for monitoring and evaluating many previously neglected aspects of the quality of power line voltage.

It became imperative to determine some kind of practical limits to which a.c. power lines can be "kept clean" and to which high tech equipment can be "toughened" to survive and tolerate at least a designated unavoidable level of contamination in the power lines as being acceptable.

The technical detective work necessary to ensure compliance with regulations in this field is highly statistical in nature, even regarding such basics as calender time and geographic location, since weather and electrical storms are often strong and highly unpredictable factors. The available existing instrumentation for this kind of investigation has been found lacking in sophistication to meet the new demands of the ever-increasing problem case loads that are building up in this evolving field.

An example of a standard that has evolved in response to this problem, in 1983 the U.S. Department of Commerce published a guideline, summarizing the fundamentals of powering, grounding and protecting sensitive devices under the title "Federal Information Processing Standards (FIPS) No. 94". This was approved and adopted by CBEMA, the Computer and Business Equipment Manufacturers' Association.

Figure 1:
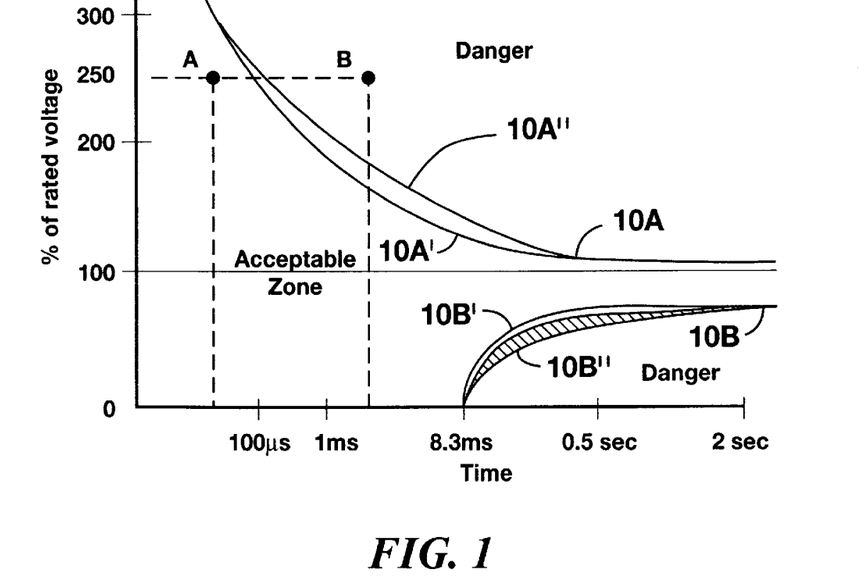
FIG. 1 is a graph of a simplified version of the industry standard CBEMA curve.

FIG. 1 depicts a simplified version of the "CBEMA Curve" that was developed by CBEMA and other industry members in an effort to characterize power line voltage anomalies such as dips, swells, outages and other transient effects based on both amplitude and time duration of the anomaly. This standard is widely recognized and utilized by designers of power line operated electronic equipment.

The y axis is marked in a scale of amplitude expressed as a percentage of nominal or rated voltage and the y axis is marked in a scale of time duration of the transient disturbance. The "acceptable zone" is between curves 10A' and 10B'; thus a high amplitude transient excursion is "acceptable" only if the duration is short enough to remain in the acceptable zone under the curve, e.g. at point A, where an excursion reaching 250% of rated line voltage is "acceptable" because its duration is well under 100 microseconds. An excursion of this amplitude will enter the danger zone if its duration exceeds about 100 microseconds: e.g. point B is deep into the danger zone due its duration of about 4 milliseconds.

Applying the curves to power-operated equipment, if such is designed and/or protected in a manner to be able to tolerate the somewhat larger acceptable zone between curves 10A" and 10B", then the overlap between the two sets of curves represents a margin of safety.

The upper danger zone corresponds to transient surges above the rated voltage, while the lower danger zone corresponds to voltage dips or sags: the shape of the lower curves indicate that complete power outages to zero volts are acceptable up to a time duration of about 8 milliseconds.

Even with the best efforts of the electrical utility entities, there can be no guarantee that the line voltage will be kept within the acceptable zone at all times, due to unpredictable adverse field conditions, so this becomes a statistical issue. Based on a study of 1,200 site months of National Power Laboratory data, a typical location can expect to experience 289 disturbances per year falling outside the CBEMA boundaries.

The CBEMA curve represents a practical baseline standard to be met or exceeded in the original design of equipment; in most instances it should be technically feasible to apply the CBEMA curve in the specification and performance of line voltage tolerance testing during the development of new equipment, specially in the case of protective equipment such as line oltage conditioners and UPS units.

Despite all precautions, there are many problems and shortfalls in this field of a.c. power quality and equipment rotection at this time that may not be overcome in the foreseeable future, thus there is a large and ever-expanding need or equipment dedicated to the monitoring and evaluation of the quality of power line voltage with regard to anomalous excursions and dropouts.

DISCUSSION OF RELATED KNOWN ART

A multi-million dollar industry has developed for power line conditioning equipment and UPS (uninterruptable power supply) equipment largely directed to the protection of computers and the like against damage and/or data loss from power line interruptions. UPS equipment can become very costly depending on reliability and the rated operational time available in the event of a power line outage. Some UPS equipment includes limited capabilities of monitoring and recording line voltage anomalies, but often such data capability is incomplete and inconvenient to retrieve and analyze.

U.S. Pat. No. 5,880,537 for an UNINTERRUPTABLE POWER SUPPLY discloses apparatus including a main motor, a smaller induction motor and a mechanical load such as a generator coaxially coupled together and a battery connected to the smaller induction motor through an inverter. This patent is of interest in discussing and comparing several different types of UPS systems; however it exemplifies UPS systems that do not themselves include instrumentation for monitoring power line quality in general and more particulary monitoring the line during transitions from and back to the regular power line or during the substitution period when the UPS takes over in an outage event. While the patent addresses the objective of making such transitions trouble-free, concern about power line transients is confined to the protection of the UPS equipment itself against power line surges and other transients through isolation techniques, and little or nothing is incorporated in the UPS or taught in the patent toward monitoring and evaluating the overall a.c. line quality, including anomalies that could occur during such transitions and during the substitution period.

Typically in known art there has been a failure to teach and provide capability of adequately monitoring the power line voltage, especially during the critical period of cut-in and cut-out of a UPS a.c. generator.

At the other extreme, full blown power line analyzers are available with very extensive capabilities but they tend to be large and expensive: typically packaged as rack-mounted units or consoles that require a substantial amount of floor space. Such large equipment is not at all suitable for field use, for example aboard marine vessels or in the increasing field of TV or radio broadcasting or other technical activities undertaken in mobile vehicles where it is often required to operate on a.c. power from emergency type generators.

There is an unfulfilled need for an independent stand-alone desktop instrument capable of monitoring, recording and evaluating power line voltage quality in detail, not only for evaluating the power line directly as received, but especially for verifying the effectiveness of any additional line voltage conditioning equipment placed into service, and in the case of UPS equipment, monitoring the critical cut-in and cut-out transition performance as well as the actual performance of the UPS while generating power in place of the regular power line, particularly when the outages extend to a time duration that challenges the UPS's capability.

OBJECTS OF THE INVENTION

It is a primary object of the present invention to provide a standalone desktop PIM (power line meter/monitor) instrument for on-line monitoring of a group of predetermined electrical power line quality parameters.

It is a further object to provide the PLM with at least a proportional visual display that provides a user-friendly continuous indication of both RMS and fast peak voltage values on a display that simulates an analog meter but that operates in a zero mass mode, free of ballistic limitations.

It is a further object of the invention to provide in the PLM the capability of monitoring, logging, accessing and displaying a primary set of parameters and logging functions, such as RMS and peak readings, time durations and intervals, directly from the PLM instrument panel.

It is a further object to enable the instrument to be connected to an external terminal or equivalent to facilitate aquiring, logging and evaluating a secondary set of parameters and logging functions, including various power line voltage anomalies of different types such as swells, dips, spikes, glitches, etc., along with related time data.

SUMMARY OF THE INVENTION

The above mentioned objects have been accomplished by the present invention of a micro-controller-based line voltage meter/monitor instrument with an LED (light-emitting diode) bar-graph simulated-analog meter display having a slightly curved scale with 40 LED segments providing resolution of one volt RMS per LED step/segment, color coded to overlay the CBEMA nominal limits. RMS values ranging from 95 to 135 volts are indicated on an upper scale, and fast peak values ranging from 120 to 500 volts at the waveform crest are indicated on the lower scale by the corresponding LED flashing at a 1 Hz rate. A variety of parameters and alarm limits can be configured by the user via a DIP switch and/or user port, accessible at the rear of the instrument. The line voltage is sensed via a broad-band isolation transformer, and processed for RMS, fast peak and zero-cross for various measurements, comparisons, storage and retrieval for evaluation. An interactive calender/clock is included.

BRIEF DESCRIPTION OF THE DRAWINGS

The above and further objects, features and advantages of the present invention will be more fully understood from the following description taken with the accompanying drawings in which.

DETAILED DESCRIPTION

FIG. 1, the simplified version of the industry standard CBEMA curve, as defined by curves 10A and 10B, was discussed above in connection with the background of the invention.

Figure 2:
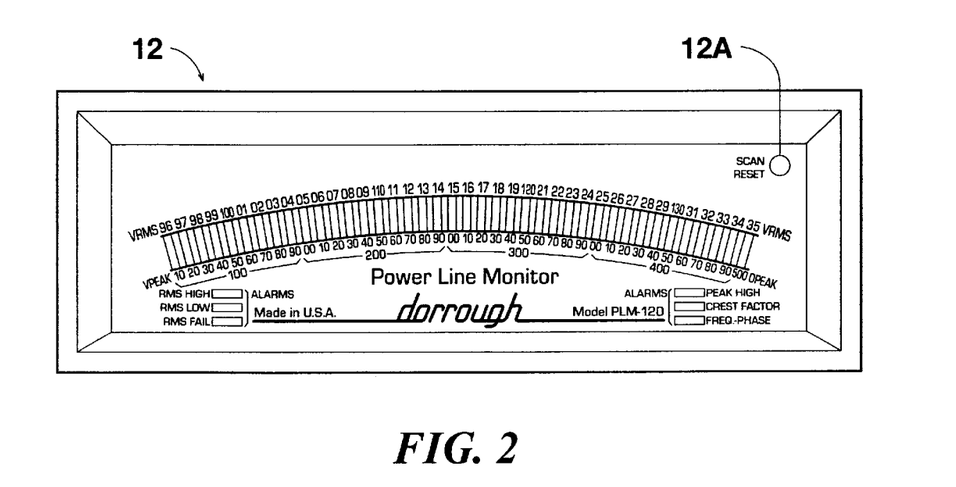
FIG. 2 is a front view of the LED display panel of a PLM (power line meter/monitor) instrument in a preferred embodiment of the present invention.

FIG. 2 is a front view of the LED display panel 12 of a PLM (power line meter/monitor)instrument in a preferred embodiment of the present invention. In the slightly arched, LED bar-graph simulated-analog meter display scale, each rectangular segment is formed by a single LED, and the scale is color coded to overlay the CBEMA nominal limits.

The display panel 12 is calibrated with RMS values ranging from 95 to 135 volts indicated on the upper scale, thus 40 LEDs provide a resolution of one volt per LED step.

Peak values ranging from 120 to 500 volts at the waveform crest are indicated on the lower scale by the corresponding LED flashing at a 1 Hz rate.

Additionally six LED segments are provided for alarm indication, three near the lower left corner to indicate RMS HIGH, RMS LOW and RMS FAIL, and three near the lower right corner to indicate PEAK HIGH, CREST FACTOR and FREQ./PHASE.

A user pushbutton 12A is provided at the upper right corner for SCAN RESET.

Figure 3:
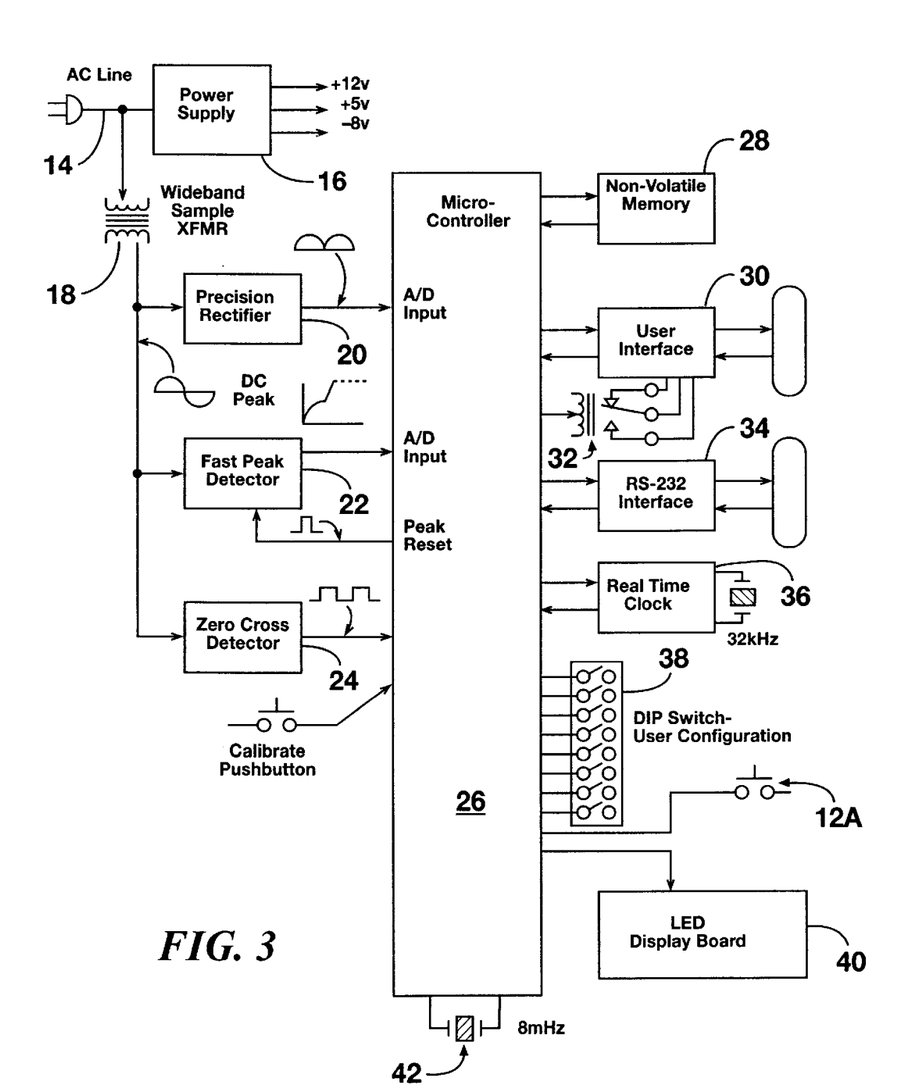
FIG. 3 is an overall functional block diagram of a micro-controller-based PLM in a preferred embodiment of the present invention.

FIG. 3 is an overall functional block diagram of a PLM that represents a preferred embodiment of the present invention.

The a.c. line input is applied via a heavy duty line cord 14 to a transformer-type d.c. power supply system and through a wideband sample/isolation transformer 18 which delivers the AC signal-under-test to a precision rectifier 20 from which the RMS value is to be derived in a ssmpling process, a fast peak detector 22 to provide peak readings and a zero cross detector 24 for synchronizing the RMS sampling process; these three signals 20, 22 and 24 are applied as inputs to micro-controller 26 where signals 20 and 22 will be A/D converted for further digital processing.

Microprocessor 26 interacts with:

a) a non-volatile memory 28, b) a user interface 30 for an external terminal, c) an alarm relay 32, d) an RS-232 interface module 34 that provides a communication port at the rear panel of the instrument for interlinking connection to an external computer for two way serial communication, e) a battery-powered real time clock 36 regulated by a 32 kHz crystal 30A for providing time/date stamps, f) a DIP (dual in-line pin package) switch for user configuration setup, g) the user reset pushbutton 12A (refer to FIG. 2), h) the LED display board driving display panel (12, FIG. 2), and i) the main microprocessor clock crystal 42: 8 MHz.

NOTE: Items d) and e) are options that may be included or omitted in manufacture in particular versions of the PLM.

Figure 4A:
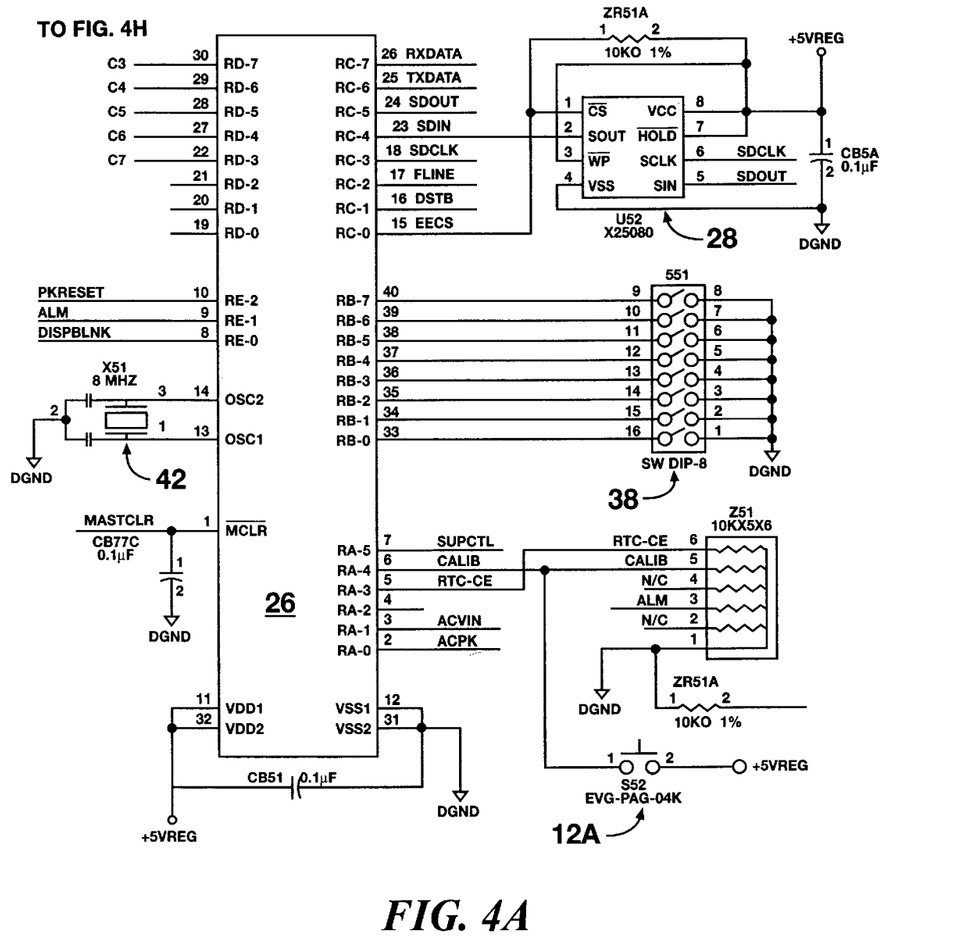
FIGS. 4A–K are schematic diagrams of various different portions of the electronic circuitry of the PLM of FIG. 3.

FIG. 4A is a schematic diagram of micro-controller 26 including some of the peripheral circuitry: non-volatile memory 28 implemented by 8 pin IC U52 (X25080), mode-selector DIP-8 switch 8/S51, resistor array Z51, front panel user reset pushbutton 12A, and 8 Mhz crystal 42/S51, which controls the main micro-controller 26.

Micro-controller 26 is implemented by type PIC16C74A-10P, a 16-bit field-programmable CMOS product, manufactured by Microchip Technology, Inc.

The DIP mode switch 38, made to be accessible from the rear, allows the user to configure the instrument according to the following assignment table (ON position active):

| Position | Mode |
| --- | --- |
| 1 | Peak display enable |
| 2 | Peak hold display enable |
| 3 | RMS high alarm enable |
| 4 | RMS low alarm enable |
| 5 | Freq/phase alarm enable |
| 6 | Crest factor alarm enable |
| 7 | Peak high alarm enable |
| 8 | User port ON: Verbose data mode, WYSE 50 term emulation User port OFF: WIN95/NT program mode |

Figures 4B, 4C, 4D:
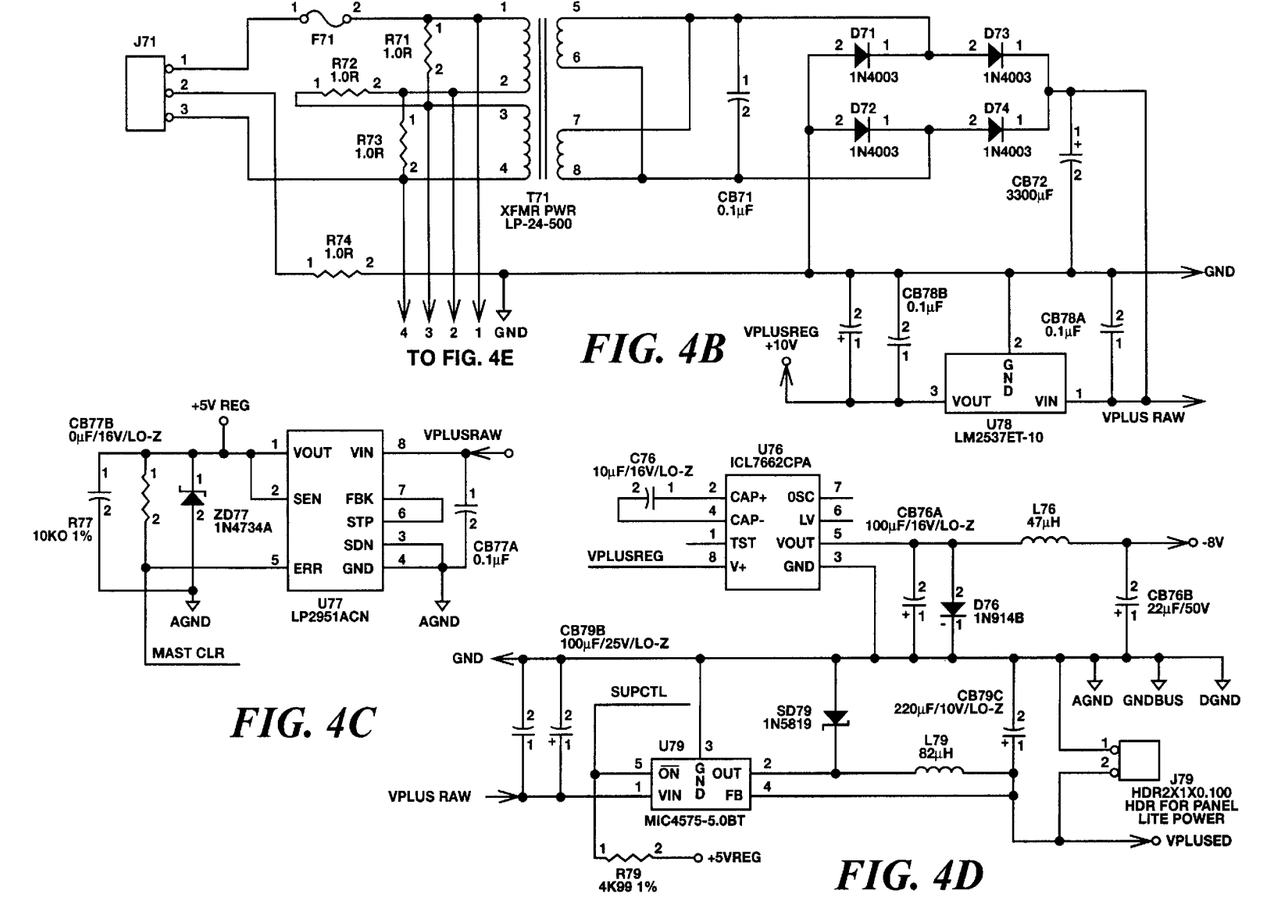

FIGS. 4B–4D are schematic diagrams of the various portions of the d.c. power supply system of the PLM.

FIG. 4B is a schematic diagram of the main power supply (16, FIG. 3): power transformer T71, receiving a.c. power line voltage from line cord receptacle J71, drives a full wave bridge rectifier circuit implemented by D71–D74 (IN4003), supplying the main unregulated d.c. voltage VPLUSRAW. This is regulated by IC U78 (LM2537ET-10) to provide the +10 volt supply bus VPLUSREG.

In FIG. 4C, VPLUSRAW, applied as input to IC regulator U77 (LP2951ACN) is regulated and delivered as +5 volts output to the +5VREG bus.

In FIG. 4D, VPLUSREG, applied as input to an inverter IC device U76 (ICL7662CPA), which provides a negative d.c. voltage as output; this is regulated by Zener diode SD79 (1N5819), filtered by choke L76 and capacitors CB76A and CB76B and delivered as −8 volts output.

Also in FIG. 4D, VPLUSRAW is applied as input to IC regulator U79 (MIC4575-5.0BT) whose output is regulated by Zener diode SD76 (IN914B), filtered through choke L79 and capacitor CB79C and delivered as the supply voltage to the LED's on the VPLUSLED bus.

Figure 4E:
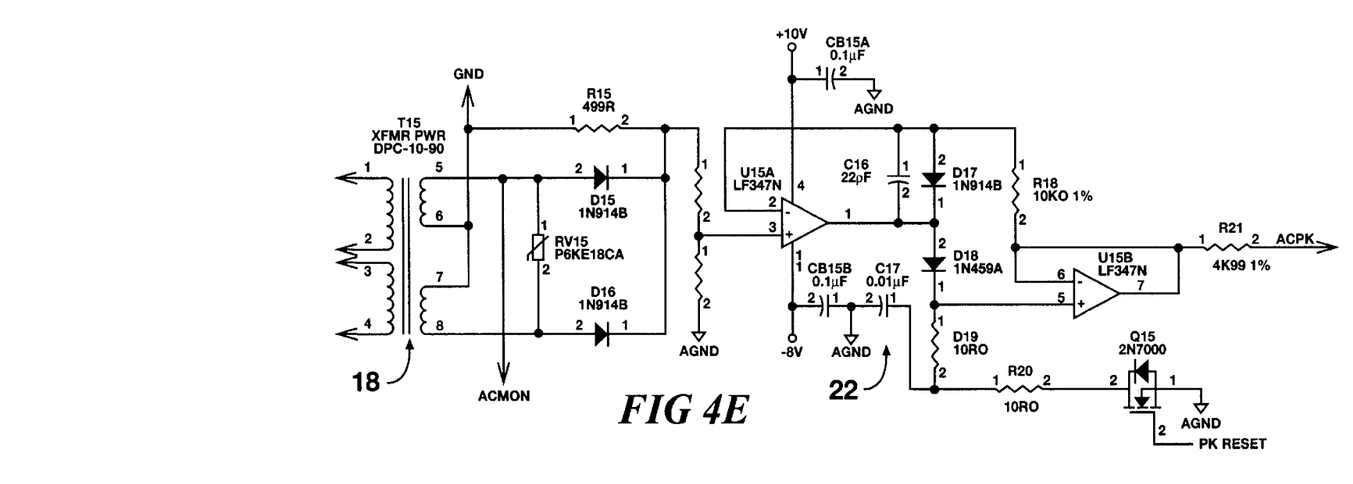

In FIG. 4E wideband sample/isolation transformer T15, with its primary connected to the a.c. power line through lines 1, 2, 3, and 4 (refer to FIG. 4B), delivers stepped-down a.c. secondary voltage to a full wave rectifier circuit with diodes D15 and D16. The rectified envelope is then peak detected by fast peak detector circuit 22 implemented by opamp U15A (LF347N) with diodes D17 and D18. Opamp U15B (LF347N), configured as a unity gain buffer, delivers the peak output signal ACPK as the basis for the peak reading display. Peak reset is provided by MOSFET Q15 (2N7000) which receives a PKRESET signal from the micro-controller.

Figures 4F, 4G:
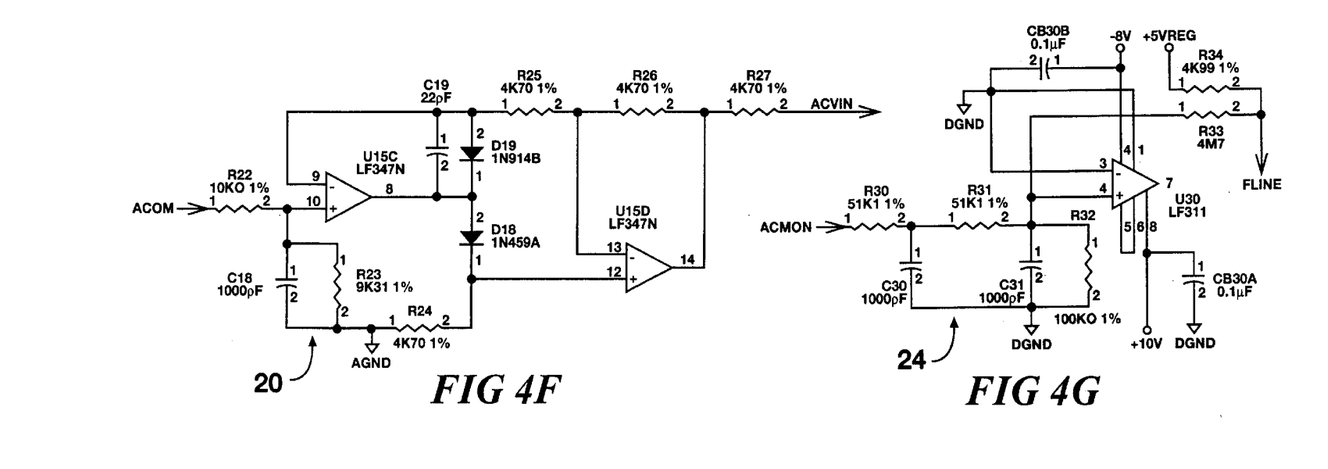

FIG. 4F is a schematic diagram of precision rectifier circuit 20 (refer to FIG. 3). A replica of the a.c. power line voltage, signal ACMON (from the secondary of transformer T15 in FIG. 4E) is received as input by IC opamp U15C (LF347N) which, with diodes D19 and D20 (1N914b), is configured as a precision rectifier delivering as output, via buffer U15D (LF347N), a precise full-wave rectified representation of the a.c. power line input waveform including fast transients, delivered to the microprocessor as signal ACVIN as the basis for RMS reading display.

FIG. 4G is a schematic diagram of zero-cross detector 24 (refer to FIG. 3). Receiving signal ACMON through a low pass filter (R30, C30, R31 and C31) which attenuates noise, IC comparator U30 (LF311) detects the zero crossings which appear as transitions in the square wave output signal FLINE. This is applied as an input signal to the microprocessor (26, pin 17, FIG. 4A) where FLINE is utilized in a phase lock loop for sychronizing the sampling process by which the power line waveform ACVIN (FIG. 4F) is sampled at 64 points of time during each power line cycle, and from which the RMS value is calculated for display.

Figure 4H:
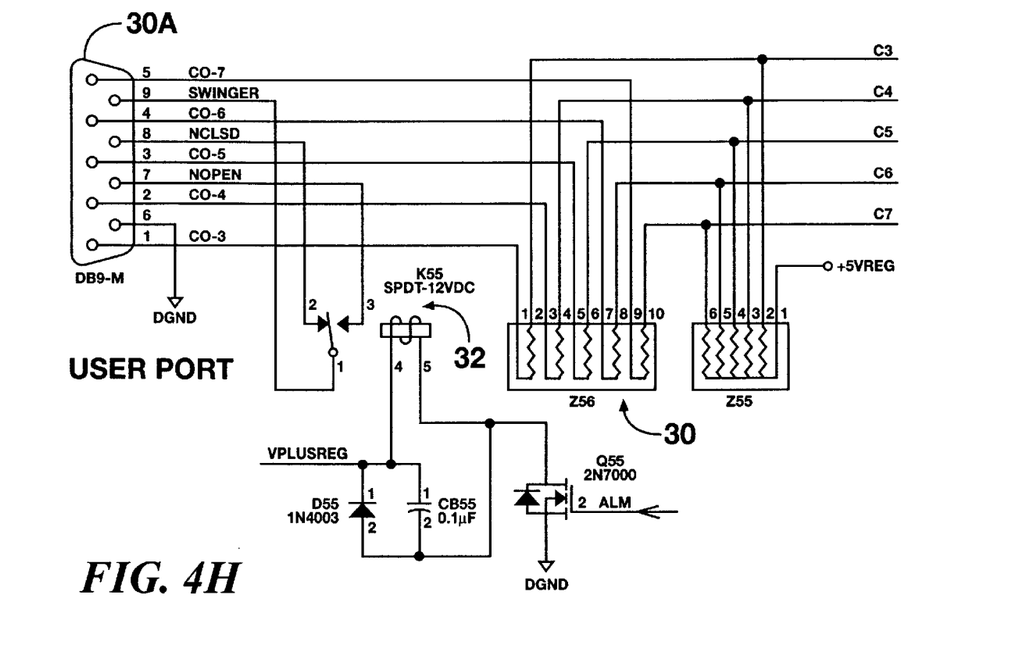

FIG. 4H is a schematic diagram of a user interface circuit 30 accessible as a console port, on the rear panel of the PLM instrument: a 9 pin male connector 30A labeled "User Port", by which the instrument's extensive logging functions can be accessed by plugging in a terminal or a PC that emulates a terminal to the user port. Communication is straight ASCII terminal emulation. Parameter lists and editing instructions are provided in the Dorrough Technical Manual, e.g. for model PLM-120.

The user port connector 30A also provides as output the three SPDT "dry" contacts of the alarm relay 32 which is controlled from MOSFET Q55 (2N7000), receiving the alarm signal ALM from the micro-controller. Resistor arrays Z55 and Z56 form voltage dividers for signals C3–7 which are applied as inputs to the micro-controller (26, FIG. 4A, upper left corner). The alarm relay 32 is controlled in the "deadman" mode, i.e. relay 32 is de-energized under an alarm condition. Thus RMS voltage failure will always de-energize the alarm relay 32. Alarms are latching in nature and can be reset by the front panel pushbutton 12A (also refer to FIG. 2) or though port connector 30A using the parameter edit function, specifically parameter 00.

Figure 4I:
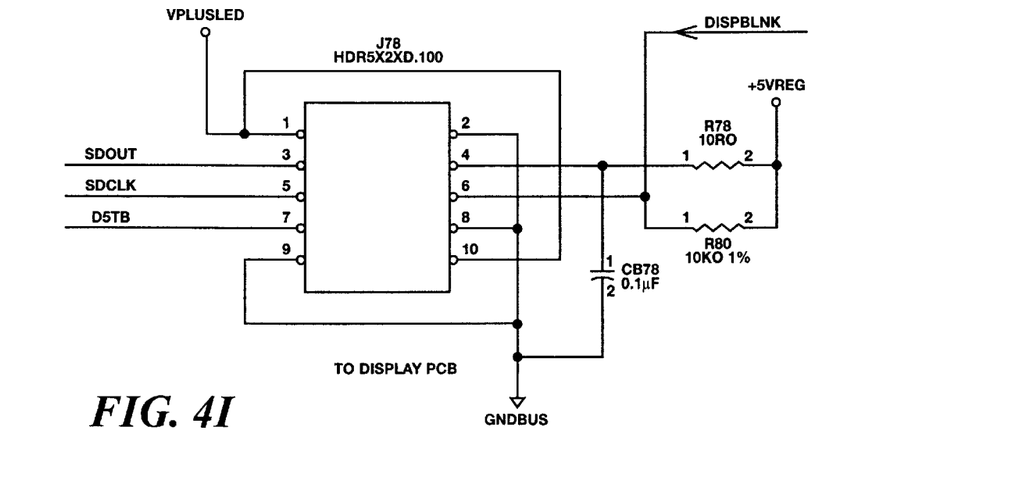
Figure 5A:
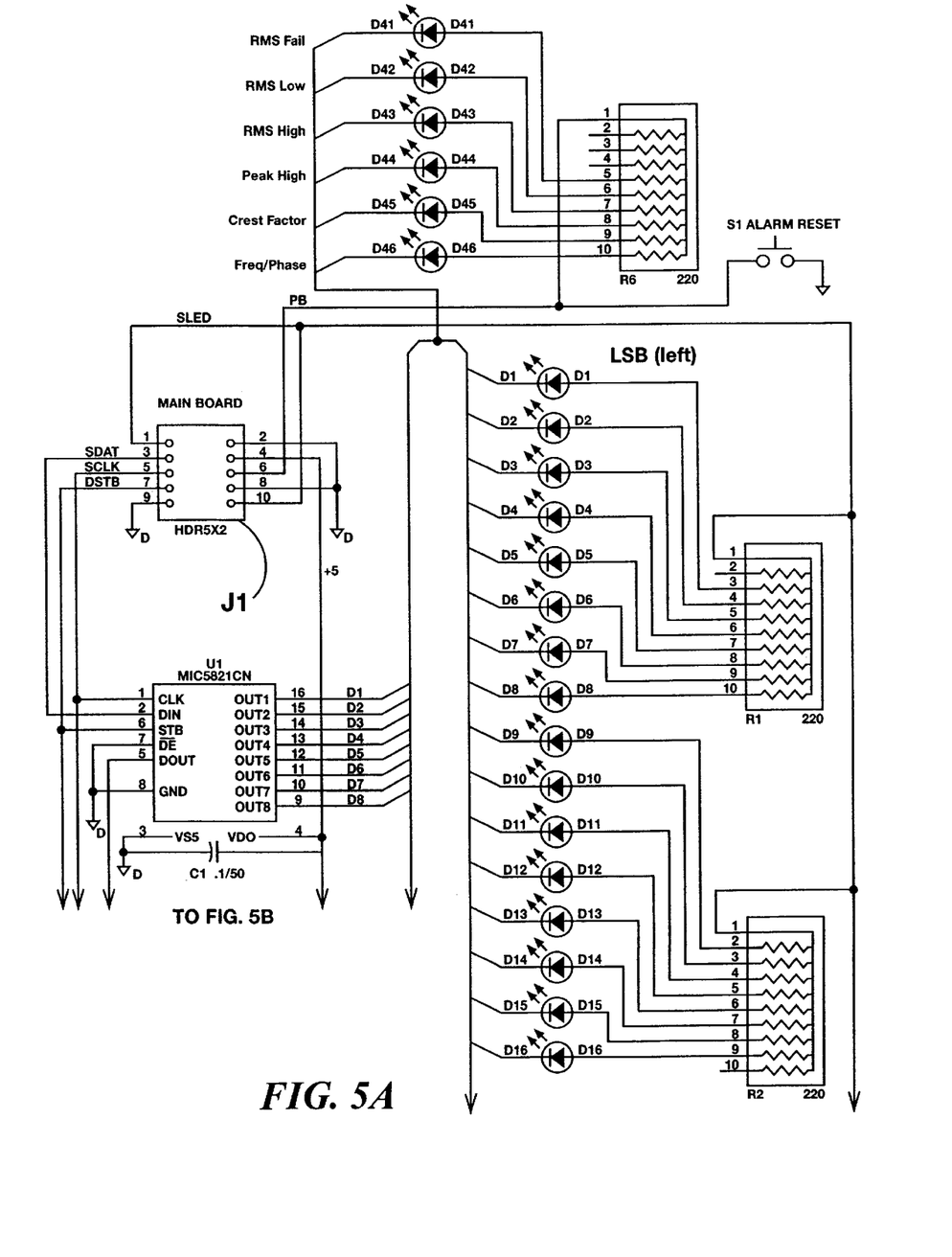
FIG. 5A and 5B are functional block/schematic diagrams of the LED display system and associated driving circuitry of the PLM of FIG. 3.

FIG. 4I is a schematic diagram including a 10 pin connector J78 (HDR5X2X0.100), which receives the display blanking signal DISPBLNK from the micro-controller (26, pin 8, FIG. 4A) and provides interconnection with the display circuit board via J1 in FIG. 5A.

Figure 4J:
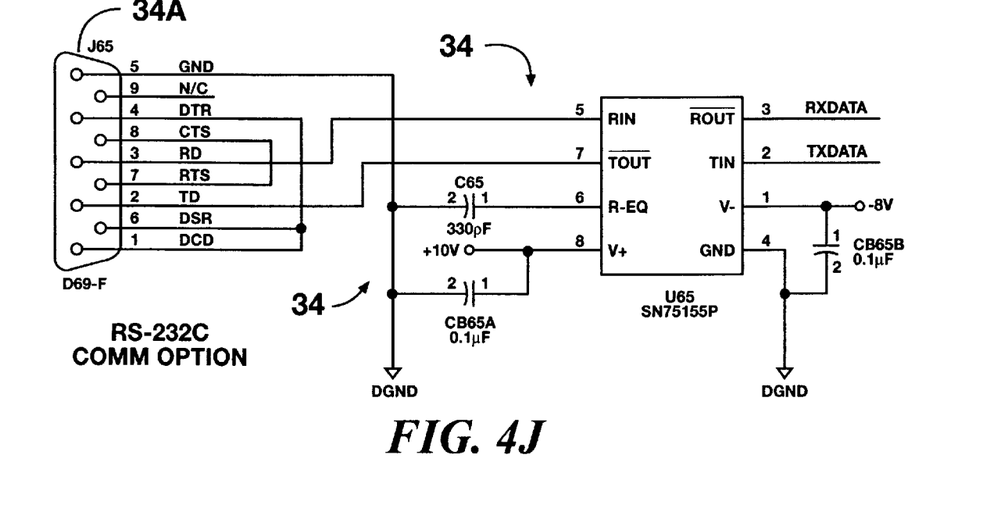

FIG. 4J is the schematic diagram of an RS-232C communication interface 34 (refer to FIG. 3), implemented as a 9 pin female connector 34A/J65 located on the rear panel of the PLM instrument and labeled "Comm. Port". Serial data from an external computer reaching pin 3 of connector 34A/J65 is applied as input at pin 5 (RIN) of two-way serial data processor U65 (SN 75155P), which provides as serial data output at pin 3 signal RXDATA which is delivered to the micro-controller (26 pin 26, FIG. 4A). Serial data to be transmitted from the micro-controller, TXDATA (at pin 25) is applied as input to pin 2 of processor U65, from which, as output at pin 7, the serial data is delivered to pin 2 of connector 34A/J65 for transmission to the external computer.

Figure 4K:
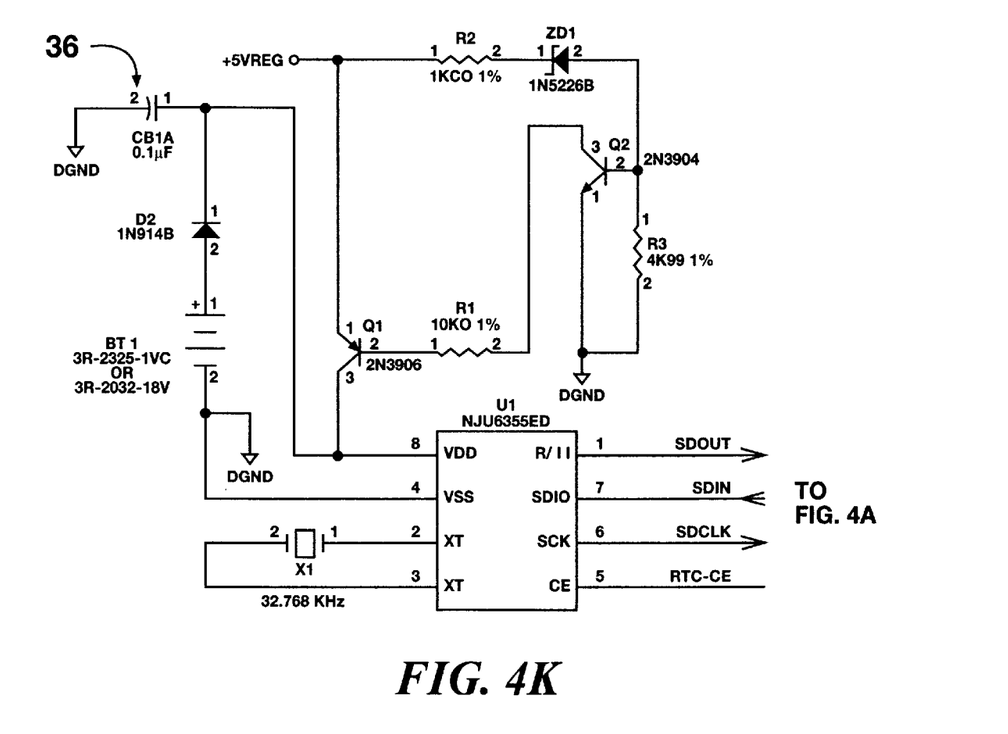

FIG. 4K is the schematic diagram of real time clock 36 (refer to FIG. 3), controlled by crystal X1 at 32.768 KHz, that provides the date and time. The four lines shown at the right of IC U1, SDOUT, SDIN, SDCLK and RTC-CE, are connected respectively to pins 24, 23, 18 and 5 of the micro-controller (26, FIG. 4A). A stand-by battery BT1 provides operating power so that the real time clock 36 will continue to operate normally through power outages.

The RS-232C feature in FIG. 4J provides the capability of two-way serial communication with an external computer, allowing the user great flexibility in setting up many parameters of the PLM to particular requirements, especially with regard to anomaly data sensing and acquisition, and alarm levels, etc. The real time clock circuitry in FIG. 4K enables the software logging protocols to enter a time/date stamp on power line events. The PLM is designed such that as a manufacturing option, the RS-232C feature in FIG. 4J and the real time clock in FIG. 4K can be included or omitted, while the more basic user interface (30, FIGS. 3 and 4H) has been provided as standard in all PLM units.

Figure 5B:
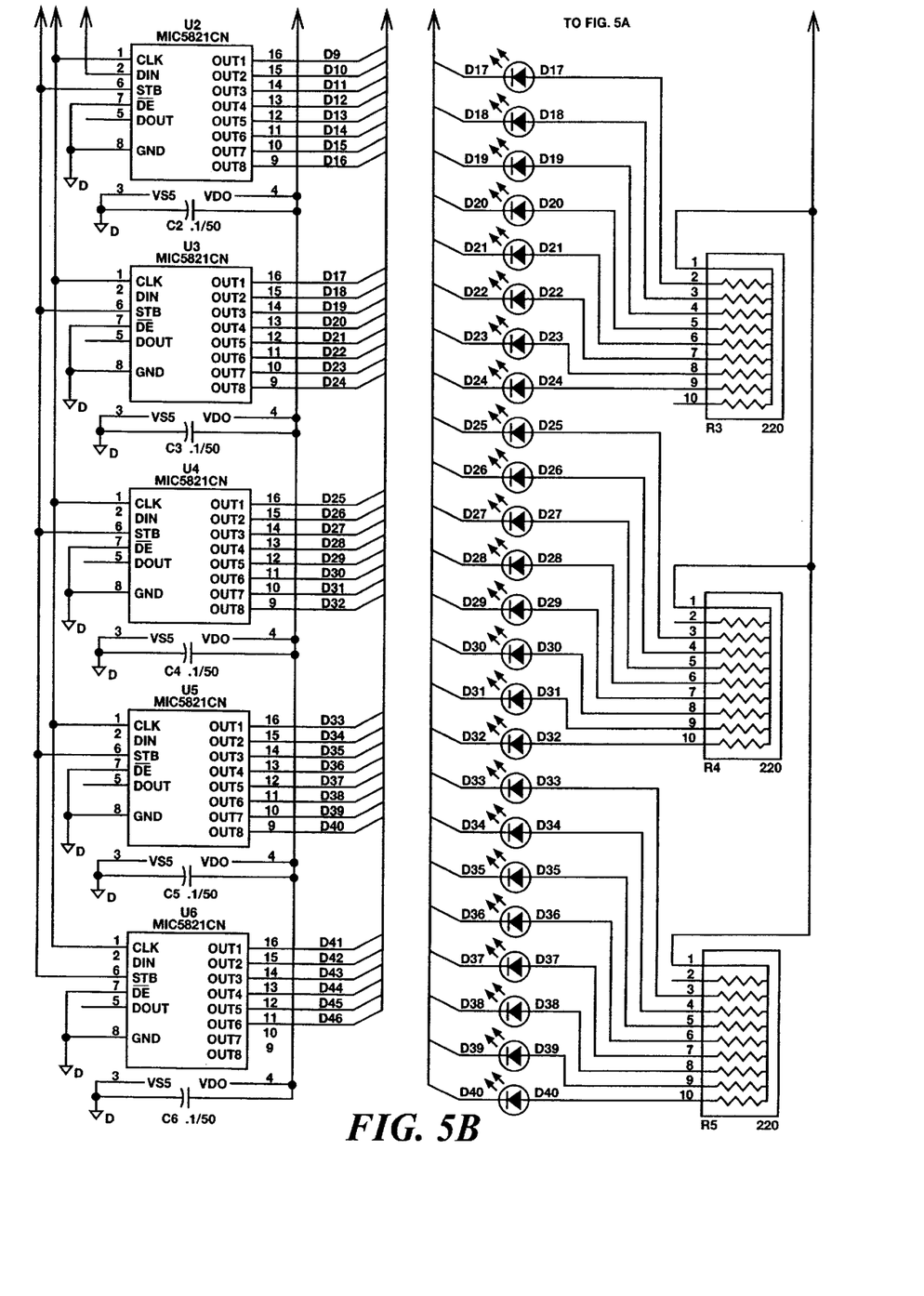

FIG. 5A and 5B are functional block/schematic diagrams of the LED display system and associated driving circuitry for the PLM as shown in FIGS. 2–4K and described above.

In FIG. 5A, a portion of the LED scale is shown, starting with the left hand end, corresponding to the LSB (least significant bit) associated with LED D1 shown at the top. Also shown is an associated driver device U1 (MIC5821CM) and a main circuit board connector J1. Shown above are the six front panel alarm indicator LED's D41–D46. Each diode is powered through an associated resistor of the resistor arrays shown, so as to limit the current to a rated level.

FIG. 5B is a downward continuation of FIG. 5A, showing the rest of the diodes D17–D40, associated resistor arrays and LED driver devices U2–U6.

In summary, the PIM of this invention can perform many useful tasks as a stand-alone instrument for sensing, monitoring, logging and displaying power line anomalies. However when advantage is taken of the instrument's ability to communicate with an external computer, the PLM becomes transformed into an even more powerful tool that can open up a wealth of possibilities limited only by the user's skills in directing the computer to manipulate the data in any desired manner.

This invention may be embodied and practiced in other specific forms without departing from the spirit and essential characteristics thereof. The present embodiments therefore are considered in all respects as illustrative and not restrictive. The scope of the invention is indicated by the appended claims rather than by the foregoing description. All variations, substitutions, and changes that come within the meaning and range of equivalency of the claims therefore are intended to be embraced therein.

What is claimed is:

1. A voltage-monitoring instrument with expanded capabilities for quality control evaluation of AC power line voltage, comprising:
    input coupling means for supplying an AC signal-under-test that replicates the AC power line voltage at reduced level while providing isolation between the power line and the instrument for purposes of safety;
    an precision half-wave detector, receiving as input the AC signal-under-test, made and arranged to provide as output a precise half wave rectified signal for deriving therefrom an ongoing measurement of RMS value of the amplitude of the AC power line voltage;
    a peak detector, receiving as input the AC signal-under-test, made and arranged to provide as output a peak-detected signal representing a peak value of the AC power line voltage; and
    a display system, including associated user controls, processing circuitry, display device and associated display drive circuitry, made and arranged to provide continuously variable ongoing visual indications representing real-time amplitude of the RMS and peak values of the power line voltage, displayed simultaneously.

2. The voltage-monitoring instrument as defined in claim 1 wherein said input coupling means comprises a voltage transformer made and arranged to operate over a predetermined wide bandwidth so as to accurately replicate line voltage waveforms including fast anomalous transitions.

3. The voltage-monitoring instrument as defined in claim 1 wherein said display device comprises a panel region containing a plurality of light emitting devices arranged in at least one single-line array, driven in a manner to display both RMS and peak voltage levels within predetermined respective voltage ranges.

4. The voltage-monitoring instrument as defined in claim 3 wherein said display device is configured as an array of LED's, i.e. light-emitting diodes, arranged and driven in a manner to display RMS voltage level in a range approximately from 96 to 135 as an illuminated bar graph, and to display peak voltage level in a range approximately from 110 to 500 volts as a dot graph distinguished by a single selected LED made to flash at a rate of about once per second.

5. The voltage-monitoring instrument as defined in claim 3 wherein said display device is configured with the LED's arranged in a horizontal array, indicating increasing amplitude from left to right.

6. The voltage-monitoring instrument as defined in claim 5 wherein the array of LED's in said display is made and arranged to arch upwardly at center in a manner suggestive of an analog meter.

7. The voltage-monitoring instrument as defined in claim 2 wherein said peak detector is made and arranged to have a fast rise time so as to accurately capture peak levels of fast anomalous transitions in the AC signal-under-test.

8. The voltage-monitoring instrument as defined in claim 7 wherein said processing circuitry is made and arranged to hold and display the peak levels at full value for a designated user-selectable period of time.

9. The voltage-monitoring instrument as defined in claim 8 wherein said processing circuitry is made and arranged to hold and display the peak levels at full value until user-reset manually.

10. The voltage-monitoring instrument as defined in claim 2 further comprising alarm circuitry made and arranged to indicate an alarm whenever an anomalous condition of power line voltage is detected as falling outside a set of predetermined specifications for RMS and peak voltage levels and inter-relationships thereof.

11. The voltage-monitoring instrument as defined in claim 10 further comprising a real time interactive calender/clock and circuitry made and arranged to register time duration of out-of-limits voltage levels, said alarm circuitry being made and arranged to indicate an alarm whenever a combination of voltage amplitude and time duration falls outside predetermined limits.

12. The voltage-monitoring instrument as defined in claim 11 wherein the predetermined limits are defined by curves published in standards adopted by CBEMA: Computer and Business Machine Manufacturers' Association.

13. The voltage-monitoring instrument as defined in claim 9 wherein said processing circuitry comprises a micro-controller and associated non-volatile memory, programmed to enable a user to process and accumulate line voltage quality data obtained from monitoring the power line over designated periods of time.

14. The voltage-monitoring instrument as defined in claim 13 further comprising:
   first and second A/D converters in said micro-controller receiving as input the half-wave signal and the peak signal respectively, made and arranged to convert these signals to digital form for further processing, and
   a zero-cross detector, receiving as input the AC signal-under-test, made and arranged to synchronize sampling by the second A/D converter for RMS processing.

15. The voltage-monitoring instrument as defined in claim 14 further comprising:
   an interface port made and arranged to facilitate two-way data communication with external data processing equipment selected from a group including controllers, keyboard terminals, computers, computer monitors, and extended data storage memory.

16. The voltage-monitoring instrument as defined in claim 15 wherein said micro-controller is made and arranged to implement alarm indication whenever an anomalous condition is detected as falling outside a set of limits defined in terms of RMS and peak voltages and inter-relationships thereof.

17. The voltage-monitoring instrument as defined in claim 16 further comprising a real time clock interacting with said micro-controller in a manner to register time duration of out-of-limits voltage levels, said micro-controller being made and arranged to indicate an alarm whenever a combination of voltage and time duration falls outside predetermined limits.

18. The voltage-monitoring instrument as defined in claim 17 wherein the predetermined limits are defined by curves published in standards adopted by CBEMA: Computer and Business Machine Manufacturers' Association.

19. A voltage-monitoring instrument with expanded capabilities for quality assurance evaluation of AC voltage delivered by a power line, comprising:
   a wideband power transformer having a primary winding connected to the power line and a secondary winding supplying the instrument with an AC signal-under-test that replicates the AC power line voltage at reduced level while providing safety isolation between the power line and the instrument;
   an RMS detector, receiving as input the AC signal-under-test, made and arranged to derive therefrom an RMS-detected signal representing a root-mean-square value of the AC signal-under-test;
   a peak detector, receiving as input the AC signal-under-test, made and arranged to derive therefrom a peak-detected signal representing a peak value of the AC signal-under-test; voltage-monitoring instrument as defined in claim 10 wherein said processing circuitry comprises a micro-controller and associated non-volatile memory, programmed to enable a user to process and accumulate line voltage quality data obtained from monitoring the power line over designated periods of time;
   processing circuitry including a micro-controller and associated non-volatile memory, programmed to enable a user to process and accumulate line voltage quality data obtained from monitoring the power line over designated periods of time;
   first and second A/D converters in said micro-controller receiving as input the RMS signal and the peak signal respectively;
   a zero-cross detector, receiving as input the AC signal-uner-test, made and arranged to synchronize RMS sampling by said second A/D converter;
   a real time calender/clock and associated circuitry, made and arranged to register time duration of out-of-limits voltage levels, said alarm circuitry being made and arranged to indicate an alarm whenever a combination of voltage amplitude and time duration falls outside predetermined limits; and
   a display device, connected operatively to said processing circuitry, having a panel region containing a plurality of light-emitting devices arranged in an array driven in a manner to provide continuously variable visual indications representing RMS and peak values of the power line voltage displayed simultaneously.

* * * * *